United States Patent [19]
Slocum et al.

[11] Patent Number: 5,921,786
[45] Date of Patent: Jul. 13, 1999

[54] FLEXIBLE SHIELDED LAMINATED BEAM FOR ELECTRICAL CONTACTS AND THE LIKE AND METHOD OF CONTACT OPERATION

[75] Inventors: Alexander H. Slocum, Bow; Rodney Scott Ziegenhagen, II, Bedford, both of N.H.

[73] Assignee: Kinetrix, Inc., Bedford, N.H.

[21] Appl. No.: 08/832,303

[22] Filed: Apr. 3, 1997

[51] Int. Cl.⁶ .................................................. H01R 9/09
[52] U.S. Cl. .................................................. 439/72; 439/67
[58] Field of Search ................................. 439/72, 71, 70, 439/73, 67

[56] References Cited

U.S. PATENT DOCUMENTS

| | | | |
|---|---|---|---|
| 3,761,842 | 9/1973 | Gandrud | 439/941 |
| 4,419,626 | 12/1983 | Cedrone et al. | 439/70 |
| 4,574,235 | 3/1986 | Kelly et al. | 324/158 F |
| 4,747,784 | 5/1988 | Cedrone | 439/71 |
| 4,773,877 | 9/1988 | Kruger et al. | 439/482 |
| 4,830,623 | 5/1989 | Owens et al. | 439/71 |
| 4,866,374 | 9/1989 | Cedrone | 439/68 |
| 4,897,598 | 1/1990 | Doemens et al. | 324/754 |
| 4,917,613 | 4/1990 | Kabadi | 439/67 |
| 4,956,604 | 9/1990 | Cedrone | 439/620 |
| 5,037,311 | 8/1991 | Frankeny et al. | 439/66 |
| 5,302,853 | 4/1994 | Volz et al. | 439/71 |
| 5,373,109 | 12/1994 | Argyrakis et al. | 439/67 |
| 5,479,110 | 12/1995 | Crane et al. | 439/67 |
| 5,552,563 | 9/1996 | Conder et al. | 174/35 R |
| 5,557,212 | 9/1996 | Isaac et al. | 324/755 |

FOREIGN PATENT DOCUMENTS

| | | |
|---|---|---|
| 2 291 544 | 1/1996 | United Kingdom . |
| 96/16440 | 5/1996 | WIPO . |

*Primary Examiner*—Neil Abrams
*Assistant Examiner*—T C Patel
*Attorney, Agent, or Firm*—Rines & Rines

[57] ABSTRACT

A novel flexible laminated beam contractor interface package for applications between chips and the like and test equipment therefor, containing a flexible core beam contractor laminated within outer ground shield beam coverings and provided with an exposed contact tip for connecting with test equipment externally to the package; and with contacts adapted flexibly to engage the chip terminals when the chip is temporarily applied to the package for testing; the laminated beam contactor preferably being shaped as bent flexible cantilever or curved beams.

6 Claims, 8 Drawing Sheets

FLEXIBLE SHIELDED LAMINATED BEAM FOR ELECTRICAL CONTACTS AND THE LIKE AND METHOD OF CONTACT OPERATION

The present invention relates to electrical contact methods and contact structures for interfacing integrated circuit parts to be tested and the testing equipment, being more particularly directed to novel flexible shielded laminate beams for electrical contacts for engaging the external connections on chips for purpose of testing the same. The same technology also has application to the design of electrical contacts in general on a macro and micro scale, such as in lead framing and flip-chips, and the like.

BACKGROUND

There are a large number of techniques and structures used over many years for creating repeatable temporary electrical contact between electrical and electronic circuits, and more recently integrated chip circuit packages, and testing devices. The interface between the chip and the tester is called the contactor, and it typically is comprised of individual contacts that have a set spring rate to create an even amount of pressure between each lead on the chip and each contact point on the contactor.

The principal problem with such contactors, however, is the fact that the spring rates that must be achieved, typically 30–50 grams of force over 0.5 mm of motion, result in the need for a long thin metal element. This creates an inherent antenna that makes the contactor more susceptible to noise, particularly as the frequency of test increases. When one sets out to design a short flexible multi-layered laminate beam, with sufficient distance between the current carrying central conductor and the outer ground layers to maintain a 50-ohm environment, for example, one soon realizes that there are more design constraints than design variables that can be adjusted. The result is that it has heretofore been deemed virtually impossible to design a laminated beam that can serve as a shielded electrical contact while maintaining typically desired spring rates necessary to make good electrical contact. The principal problem is that the stress imposed on the outer ground layers on the laminate quickly causes it to yield, causing the contacts rapidly to fatigue and fail.

The present invention, therefore, addresses the need for development of flexible shielded ground components for electronic applications, with particular application to semiconductor testing contactors. A critical element of semiconductor testing, which is often designed without regard for other components, is the contactor. The contactor is the key interface between the testing equipment and the part being tested (i.e., the integrated circuit package, chips, or DUT, the "device under test"), and it has many functional requirements including ideal electrical properties (50 ohm impedance, multi gigahertz bandwidth, no cross-talk between leads and grounds), and ideal mechanical properties (small footprint, controlled spring rate, cause no fatigue with the tester electronics board interface, and resistance to solder build-up on the contact points). Currently available contactors may satisfy some of these needs, but many functional requirements are only partially fulfilled. As a result, the rest of the mechanical system (i.e., principally the handler) is often large and bulky, and system reliability is less than desirable.

One current contactor for these purposes uses an in-line extension/compression spring, often referred to as a pogo-pin. This is usually configured as a tube with an internal coil spring that provides controlled compliance to protruding tips. Kruger, U.S. Pat. No. 4,773,877, shows such a pogo-pin with the spring integral with the tip. In this case, the system is a simple linear compression spring, and does not provide any shielding or impedance control.

With respect to bending beams, Doemens et. al., U.S. Pat. No. 4,897,598, shows a single curved beam system. This beam, however, also has no shielding, and in addition, a single curved beam will have far too much scrub, which is relative motion between the tip and the chip lead.

Another typical problem with contactors is the improper use of ground planes. U.S. Pat. No. 4,866,374 shows a ground plane and an insulating layer (dielectric) which actually encourages crosstalk between the lead. Furthermore, this type of contactor, with its long exposed lead tips is very susceptible to picking up electrical noise, and to damage of the exposed leads.

In addition, it is not just the contactor itself that creates difficulties in test; the size of most existing contactors requires their center-to-center spacing to be much larger than the center-to-center spacing of the chips in the storage trays. Consequently, the handling devices that take the chips from the trays and press them into the contactors become more complex. That is, the handlers must have complex robotic motions to spread the chips apart, which often require an intermediate station, further increasing complexity.

For the first time, the present invention satisfies all the functional requirements for an ideal contactor by combining technologies from different disciplines, not normally used in the art of contactor design and manufacture, along with novel new physical component shapes. The contactor is an assembled system with mechanical beams, that form the electrical contacts, and which are packaged in a structure that allows it to be mounted to the test system. The heart of the contactor, however, is the mechanical beam structure involving laminations with a contoured ground cover, which effectively shields high frequency signals, remains flexible being positioned on top of a coextensive insulating layer on a core conductor, and with the same lamination structure provided on the opposite side. Soldered-in-place or monolithic plated contact points project from the tips of the mechanical contacts to engage the electrical connections on chips or other devices that are being tested.

OBJECT OF THE INVENTION

An object of the invention, accourdingly, is to provide a new and improved test interface, using the advantages of a flexible laminated shielded beam contact structure and contacting method.

A further object of the present invention is to provide a new and improved flexible electrical contact method and structure for temporarily interfacing electric devices, such as a chip, to test or other equipment, and wherein the central conductive path of the connection is effectively electrically shielded by grounded outer layers.

Still a further object is to provide a contactor with high repeatability of flexing without permanent deformation.

Other and further objects will be explained hereinafter and are more fully delineated in the appended claims.

SUMMARY OF THE INVENTION

In summary, from one of its viewpoints, the invention embraces a contactor assembly for temporary interfacing between an electrical part-to-be-tested, such as an integrated circuit part, and the testing equipment, the contactor having, in combination, one or more flexible mechanical beam structure assemblies comprising a central core conductor beam to the opposing surfaces of which have been laminated co-extensive insulating layers with each layer in turn laminated to an outer contoured co-extensive ground covering that serves as an electrical shield; the contactor beam have a terminal contact zone to provide an exposed contact tip for connecting to the test equipment; and the contactor assembly being provided with means for temporarily attaching the electrical part-to-be-tested to the assembly and in electrical contact with the contactor beam.

Preferred shapes and other best mode design features and methods of operating are hereinafter explained in detail, and more particularly delineated in the appended claims.

DRAWINGS

The invention will now be described with reference to the accompanying drawing in which.

PREFERRED EMBODIMENT(S) OF THE INVENTION

Figure 1:
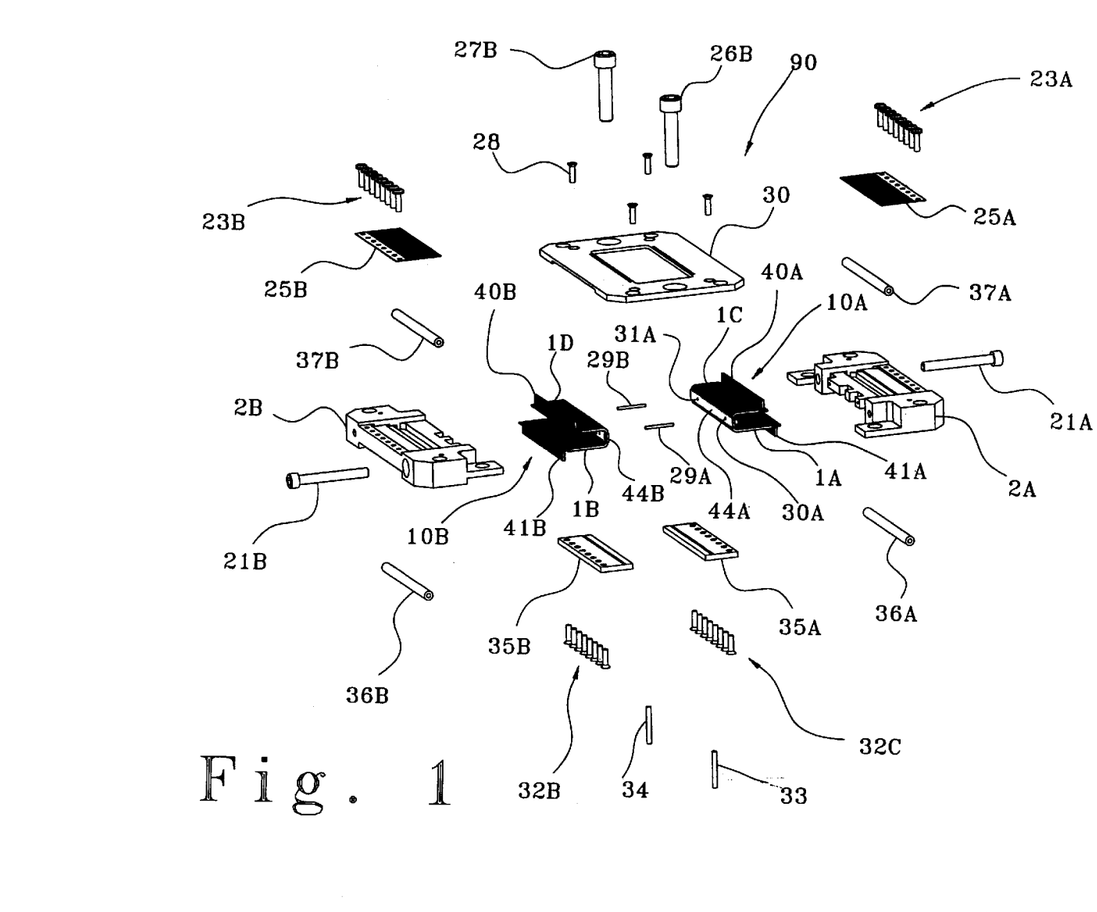
FIG. 1 is an exploded parts view of a typical contactor assembly that, in accordance with the invention, utilizes laminate beams.
Figure 2:
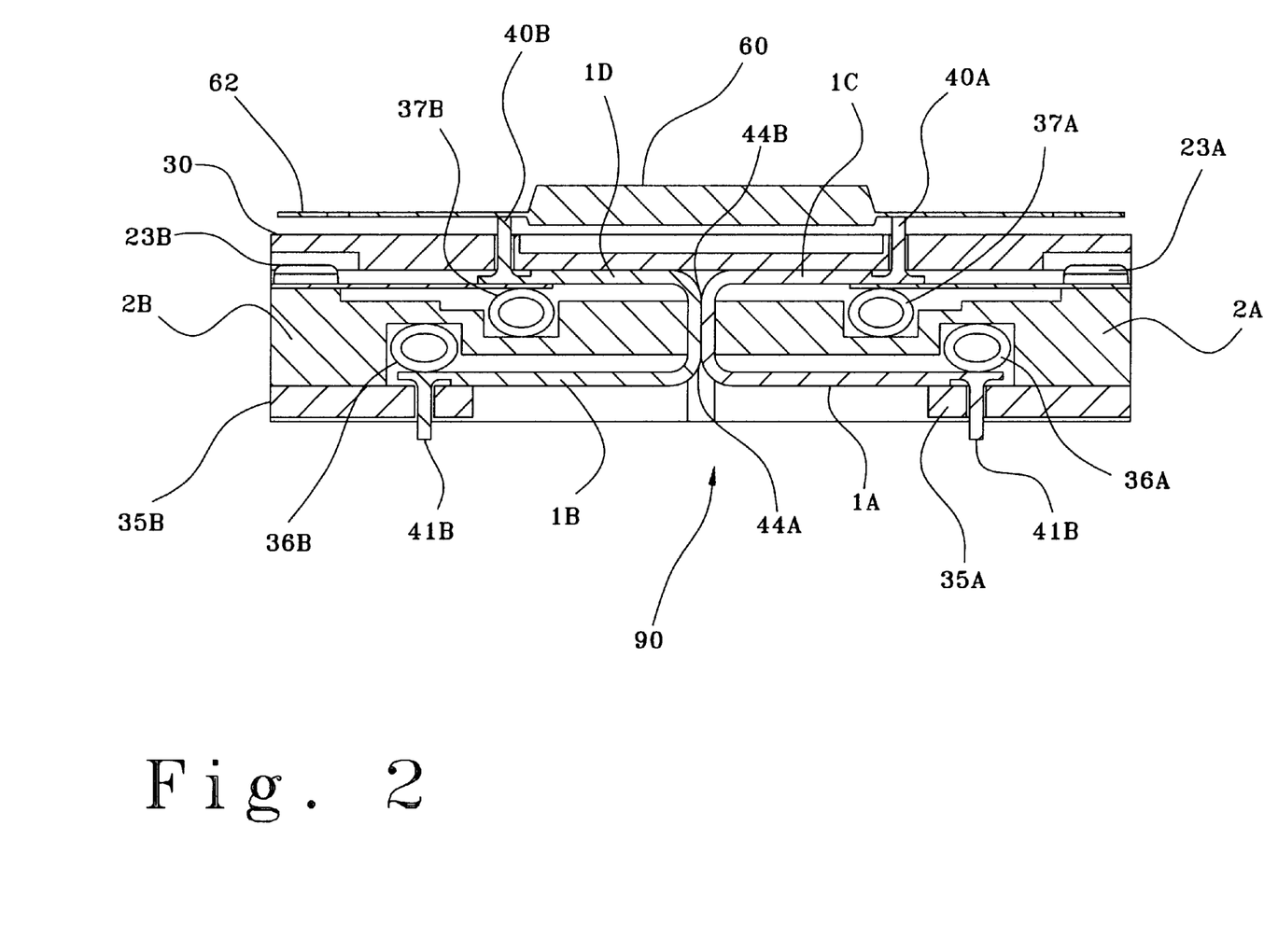
FIG. 2 is a cutaway side-view, on an enlarged scale, of the contactor assembly shown in FIG. 1.

FIG. 1 shows an exploded parts view of a contactor 90 constructed in accordance with a preferred embodiment of the invention; and an assembled middle section view of which is shown in FIG. 2 upon an enlarged scale. The contactor 90 utilizes the novel laminate construction of the invention to provide good electrical shielding, controlled impedance, and controlled mechanical spring rate and stress in the co-extensive laminate layers as later explained. Laminate structures 10A and 10B are shown bent into U shapes which then have in effect upper and lower cantilever beam sections 1A, 1C and 1B, 1D, respectively. The bent beams 10A and 10B are attached or anchored with abutting waists 44A and 44B to base structures 2A and 2B. Alignment is maintained by pins 29A and 29B, FIG. 1, that pass through holes in the laminates (such as 30A and 31A) and into corresponding holes in the structures 2A and 2B. Bolts 21A and 21B clamp the entire structure together horizontally, and pins 33 and 34 (shown vertical) help to maintain alignment.

Tips such as 41A and 41B connected through lower beams 1A and 1B, respectfully, protrude through bottom plates 35A and 35B, FIG. 2, which are attached to structures 2A and 2B with screws such as 32C and 32B, FIG. 1. These tips make contact with an instrument, being preloaded by the spring effect from the cantilever beam elements 1A and 1B, and they do not actively see cyclical loading during testing of chips. They are in effect isolated from the cyclical loading of cantilever beam elements 1C and 1D by the clamped waists 44A and 44B.

Conductive tubes 36A and 36B, although optional, may be used to provide additional spring force, or additional grounding at the tips of the contacts. These tubes may be in the form of a conductive outer layer elastomeric tube, or an appropriately formed and, if needed, slotted metal tube. A similar set of tubes 37A and 37B can be used mechanically and electrically to tune the performance of the upper laminate beams portions 1C and 1D.

Upper laminate beams 1C and 1D also have contact tips 40A and 40B attached to them, and they project up through holes in the cover plate 30 which is held to the structures 2A and 2B by screws such as 28. Screws 26B and 27B bolt the entire assembly down to an instrument to which the contactor is to be attached.

There may be instances, however, where the laminates provide the deflection desired, and have the low beam element stresses needed for long life, but they cannot also provide the desired spring rate. In such cases, the beams need helper springs. As discussed, these helper springs can be the tubes 37A and 37B, or the tips of the laminate beams 1C and 1D can be supported by cantilever comb-like spring structures 25A and 25B, respectively, held by elements 23A and 23B.

The contact tips 40A and 40B make electrical contact with respective leads 61 and 62 on a chip such as 60 shown in FIG. 2. As the chip is pressed or plugged into the contactor, the beams 1C and 1D bend and the reaction force makes the tips break through any oxide layer on the chip's electrical terminals or leads, ensuring good electrical contact.

This contactor assembly embodiment is exemplary of a wide variety of structures that can be created using the novel laminated beam construction concept of the invention. The laminated beam design can have several embodiments, ranging from a solid outer conductive layer, where the cantilever beam length is long, to a specially etched geometry for short beams, where beam stresses must be reduced to avoid early failure. It can also be employed in any of many different types of conductors, commonly referred to as stripline, by those skilled in the art.

Figures 3, 3C, 3D:
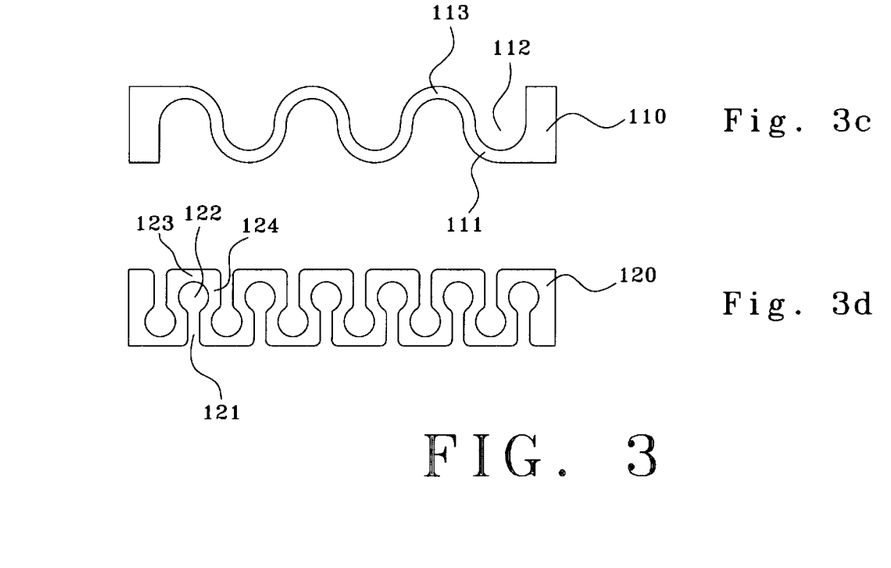
FIG. 3 shows four types of outer laminate layers: a prior art conventional solid outer layer, a prior perforated outer layer, and a serpentine outer layer, and a keyholed outer layer in accordance with the invention.
Figure 3A:
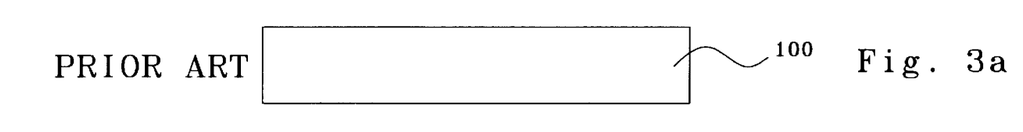

FIG. 3 shows four different types of outer laminate layers. FIG. 3A shows the solid layer 100 that is normally seen on composite beams. The problem is that when a beam is short and the deflection large, the outer layer 100 can become so highly stressed that it yields. A normal reaction from one skilled in the art would be to reduce the modulus of elasticity, but that is accompanied by a reduction in strength; so the problem cannot be thusly solved for short beams (short with respect to the thickness of the composite beam as a whole).

Figure 3B:
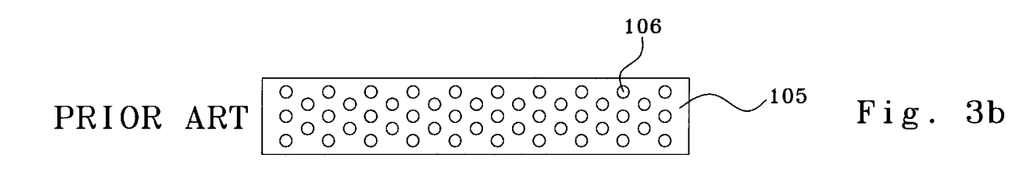

In FIG. 3B, a prior type of perforated layer 105 is shown, where the holes 106 are intended to reduce the stress in the beam, as is claimed by some manufacturers, to enable the laminate to be more easily bent around a corner during forming. However, in reality, this does not reduce the stiffness, because there are still essentially direct tensile elements along the beam length.

What is needed, rather, is to create the effect of reducing stiffness in the outer layer of the laminated beam, without reducing strength. This is accomplished by the present invention as shown in FIG. 3C by the structure 110, where instead of the solid structure 100, FIG. 3A, the structure is etched to form an S-shaped serpentine path where gaps 112 interlace with structure 111 and 113. As long as the wavelength of the serpentine path is considerably shorter than the wavelength of the electrical signal the laminate structure is to carry, then good shielding and electrical impedance will be achieved. For shorter wavelengths or for very stringent shielding characteristics, the keyhole gaps or serpentine design 120, shown in FIG. 3D, can be used, where keyholes 122 with stems 121 are cut to leave metal regions 123 and 124.

For a relative measure of the stress in these prior art type beams 100 and 105, FIGS. 3A and 3B, and the beams 110 and 120 of the invention (FIG. 3C and 3D), finite element analysis can be used to show relative stress normalized by the solid beam (including stress concentrations in the corners) to be: 1.00, 1.47, 0.24, and 0.23 respectively. The perforations of FIG. 3B actually increase the stress because they also form stress concentrations. The keyholes in layer 120 offer much greater surface area to create an even greater shielding effect and lower stress than in the sinusoidal serpentines of FIG. 3C.

The fundamental aspect of this design is that the outer layer of a laminate beam deflected about its anchoring base by a fixed amount Δ is essentially being axially stretched by fixed amount δ. The outer layers are essentially springs; and thus, given a solid sheet of any width, thickness length L and modulus E, such as 100, and stretched a fixed amount δ, a very high stress is realized as given by:

$$\sigma = \frac{E\delta}{L}$$

It is very important to notice that the stress is independent of the width of the beam. In the past, manufacturers have tried to reduce outer layer stress by etching holes to create a perforated pattern, but the false illusion they get is a reduction of beam spring rate, but the high stress levels remain the same as if the holes were never formed. It is essentially impossible to design a small laminated beam without causing excessively high stresses in the outer layer that yields and cause the beam to fail.

Furthermore, it is important to note that with this method, each conductor (laminate beam) has its own independent grounded shielding layer. This allows each conductor to be shielded from its anchor base nearly out to its tip, while maintaining independent flexing action between the conductors. If the laminate beams had a common outer grounded layer out to near their tips, not only would they be mechanically coupled, they would also be electrically coupled, which would severely limit the electrical bandwidth of the signals in the conductors.

The invention provides a structure that can yield a 50 ohm or other desired impedance electrical path all the way through the structure. The central electrically conductive core is narrowed by positioning between the two outer serpentine ground strips in the same plane, and laminatingly sandwiched between coextensive ground and insulating planes. Holes through the sandwiched structure will allow for plating through the holes to connect all the ground planes together to provide even better shielding and hence greater bandwidth. Each conductor moreover, is provided with an independent shielded controlled impedance environment, so the ground plane of one will not crosstalk to the ground plane of another, very nearly to the tip of the conductor. The modular contactor structure also allows the contactor to be built up in a modular fashion. In the two-sided contactor of the invention, furthermore, one side bears the alternating fatigue load of chips making contact, but the other side does not see an alternating force at the electrical contacts, so it does not wear the interface to the electrical tester.

The fundamental aspect of the present invention, therefore, is to accommodate the set displacement on the surface of the beam through the use of transverse bending elements created by the notching process that creates the structures 110 and 120, FIGS. 3C and 3D. Other types of notches can also be formed as can now be evident to one skilled in the art.

Note that strain gauges use an orthogonally different approach, where they utilize long thin serpentine loops to increase the effective length of conductor in tension in order to affect the conductor resistance. The present invention, on the other hand, seeks to accommodate an entirely different effect, where the conductor is thin and long and must be made more flexible by minimizing the sections in tension.

There are many electronic circuit applications that use so-called meandering path connections to produce delay times in signals, such as in television circuits where the video and audio signals must be tuned. Such applications which show serpentine circuit pathways, however, are static structures where the serpentine shape is optimized for electronic delay characteristics. In these applications, unlike the structures of the present invention, the serpentines have no structural characteristics, and they are not subject to applied stress.

In practice, with proportions shown, stress levels can be reduced by up to an order of magnitude, but factors of 2 are common, by using this method. Furthermore, since 90% of the strain energy in a beam is concentrated in the first 30% of the beam, the number of loops formed is not neccessisarily high.

Figure 4:
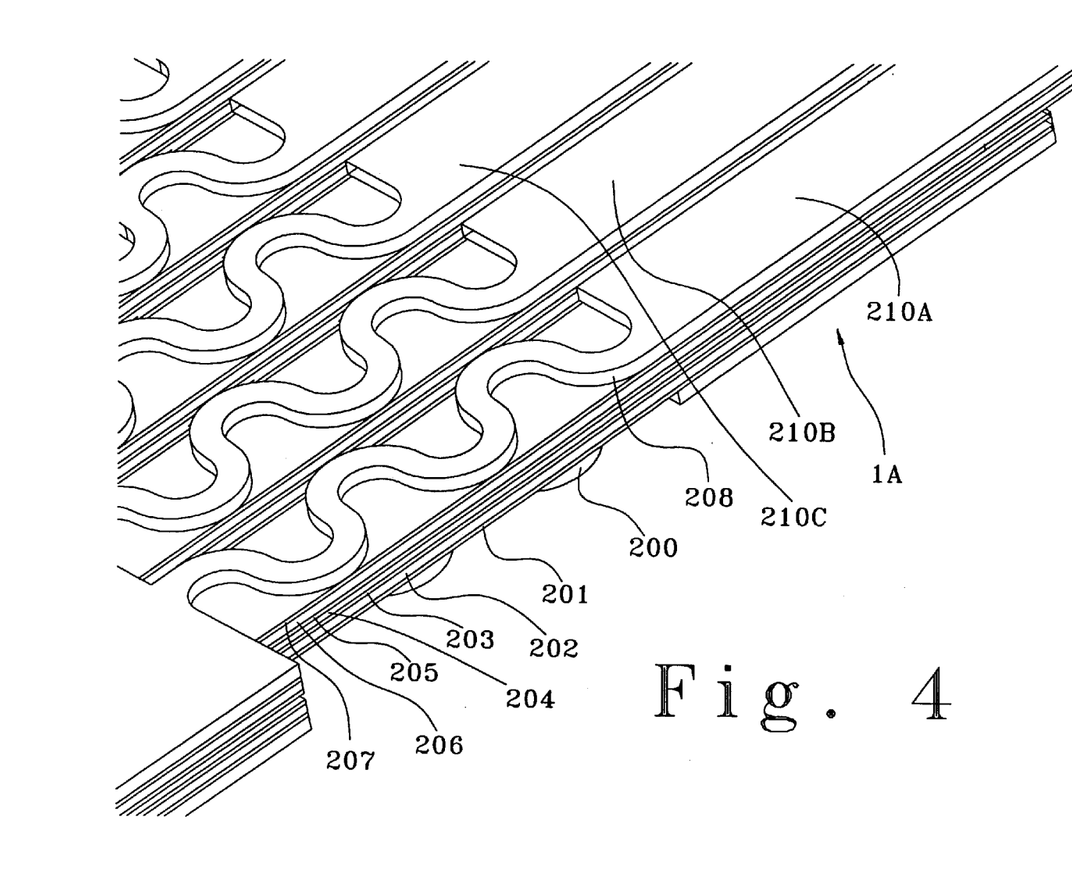
FIG. 4 is an isometric view of one of the laminate sheets.

FIG. 4 shows a close-up isometric view of one of the laminate structures 1A with many beam elements 210A, 210B, etc. The laminate has outer serpentine ground layers 208 and 200 that shield the inner conductor layer 204. Layers 201, 203, 205 and 207 are adhesive layers, and layers 202 and 206 are a dielectric material such as "Kapton". It can be seen that the serpentines 200 and 208 are 180 degrees out of phase with each other, which prevents the beam from twisting as it deflects.

Figure 5:
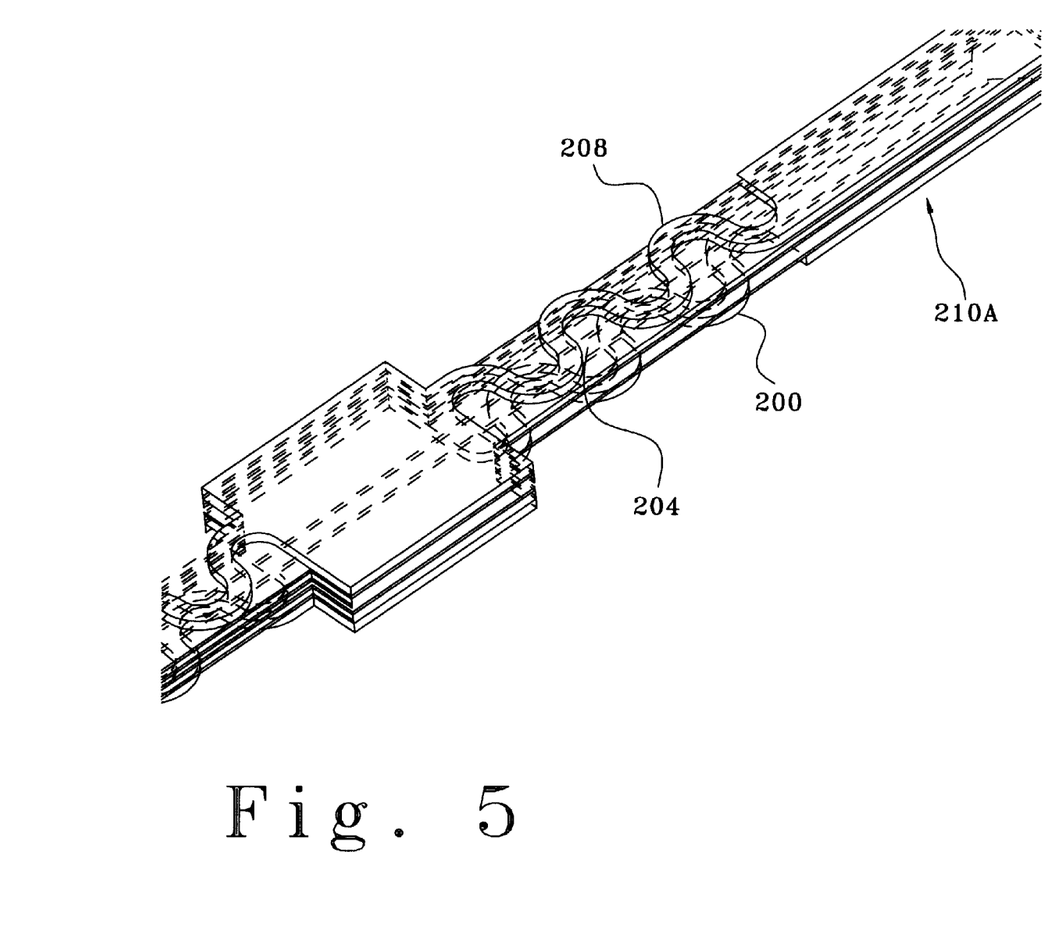
FIG. 5 is a see-through isometric view of one of the laminate beam elements.
Figure 6:
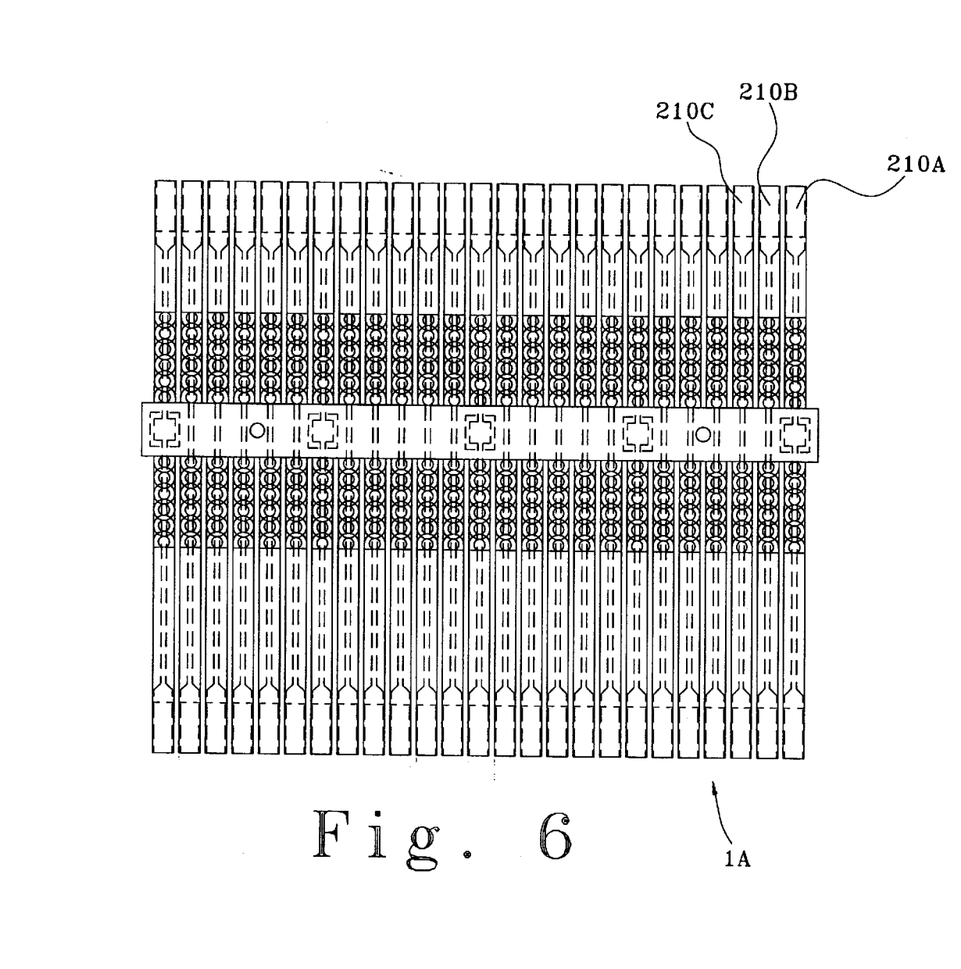
FIG. 6 is a plan view of one of the laminate sheets prior to being bent into the U shape used in FIG. 1.

FIG. 5 shows a hidden-line close up drawing of one of the beam elements 210A FIG. 4, where the central conductor core 204 is sandwiched between the ground layers 200 and 208. FIG. 6 shows the entire pattern of beams as they would appear after being laminated and etched.

When the present invention is used, typically finite element analysis is used to obtain an equivalent effective modulus for the outer layer, such that the bending theory presented herein can be used, where it assumes that the outer conductive layer is solid, but with a substantially reduced modulus of elasticity, but it still retains the high yield strength of a metal, such as hard copper alloy.

Figure 7:
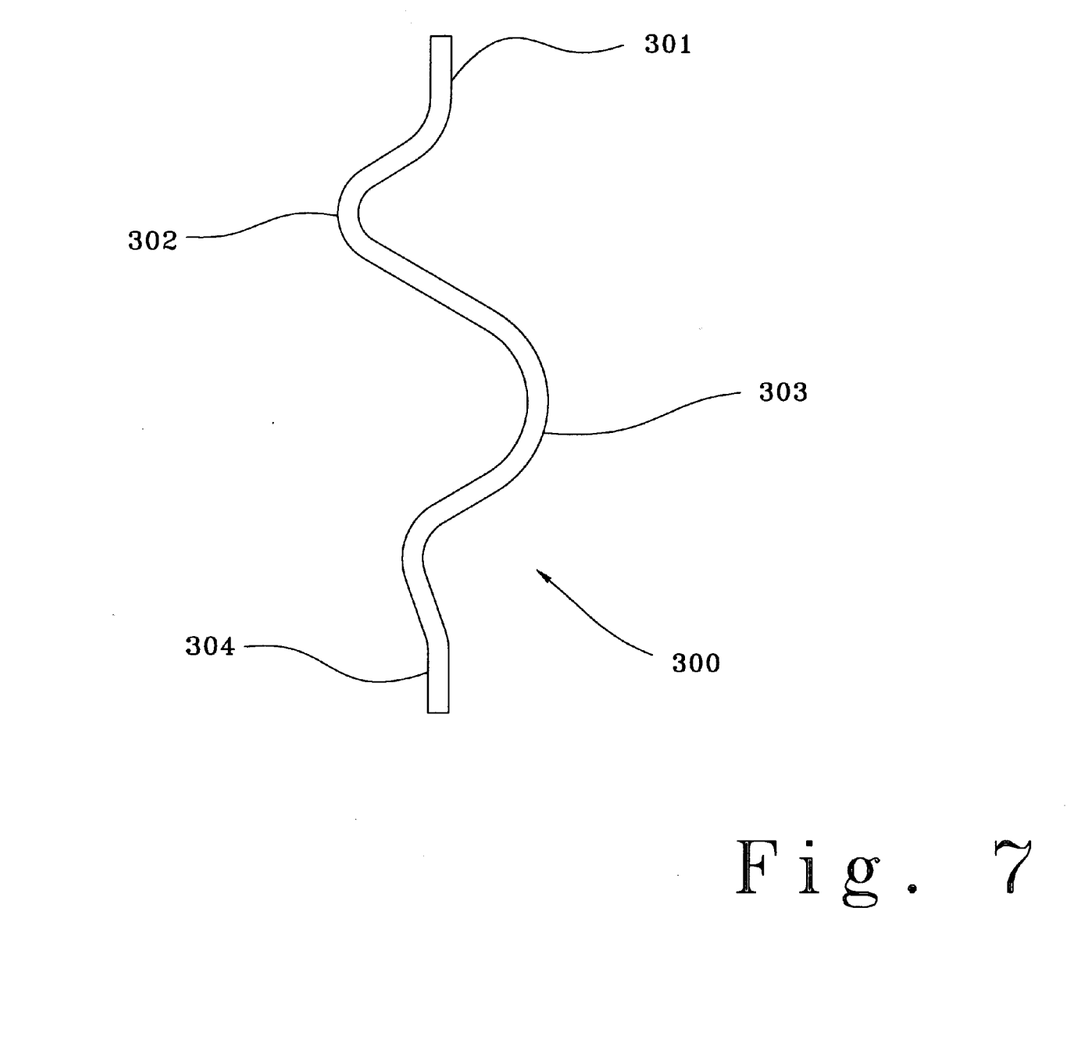
FIG. 7 is a side schematic view of a double curved beam shape that the laminate may also be formed into for added tuning of deflection components.

In addition to simple cantilever beams, more complex curved beams can also be formed to optimize the stiffness of the system. FIG. 7 is a side schematic view of a double curved beam 300 into which the laminate can also be formed for added tuning of deflection components. The tip 301 would make contact with the chip, and the curved beam sections 302 and 303 would be sized to ensure that the downward deflection of the tip 304 did not have too great a lateral component, which is referred to as the before mentioned scrub. The bottom tip 304 would make contact with the instrument. When a tip contacts a chip, some scrub is desired to help break through the oxide layer that forms on the leads, but too much scrub leads to excessive solder buildup on the tips, which itself leads to failure of the contactor.

Figure 8:
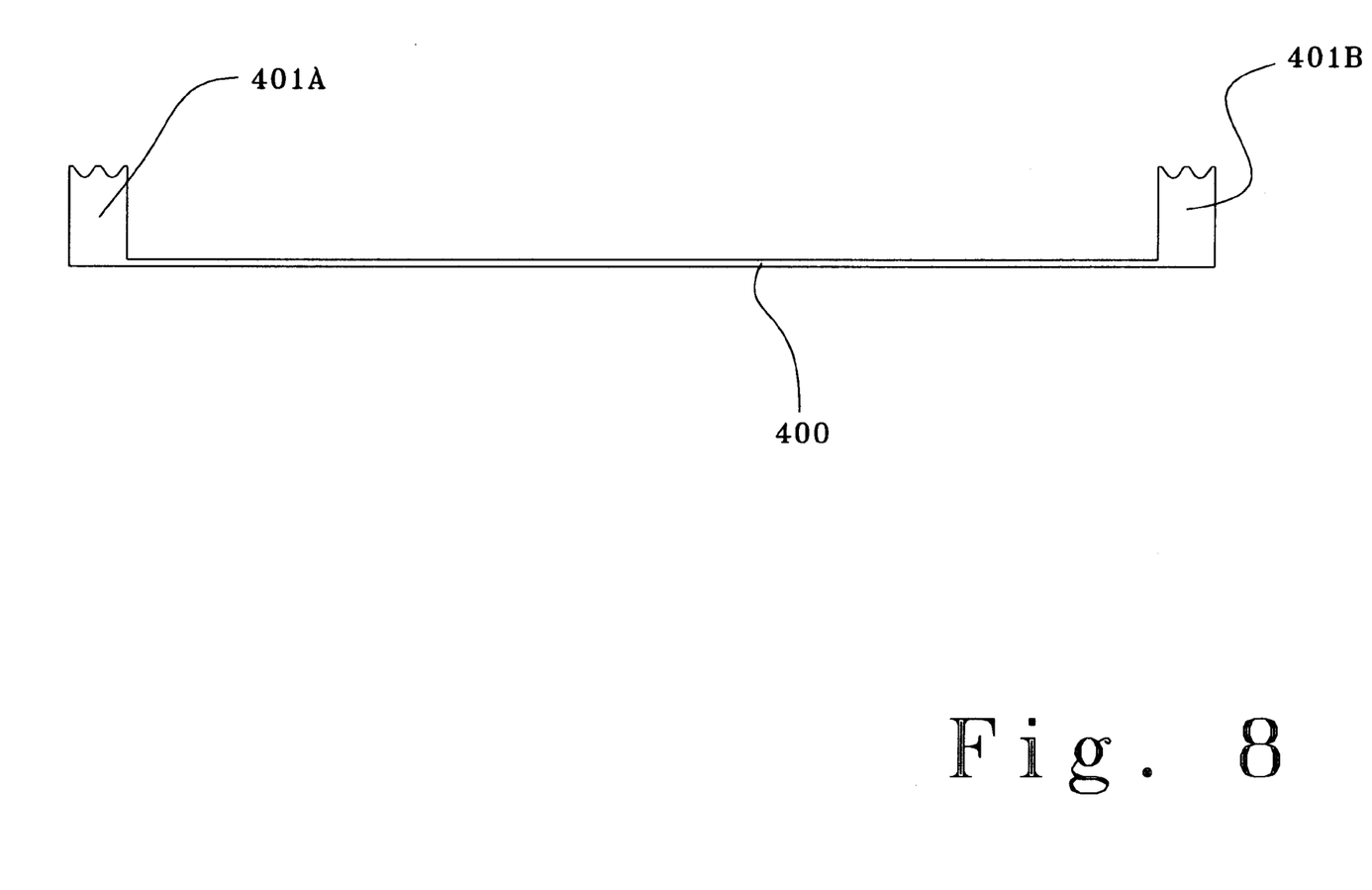
FIG. 8 is a side schematic view of a monolithic conductive core with integral contact tips that is useful in construction of the laminate.

FIG. 8 shows a side schematic view of a contactor center core conductor 400 before it has been laminated and formed. The tips 401a and 401b in this case are an integral part of the conductor, so as to avoid any problems with forming or soldering the tips.

In all cases, however, the invention comprises a laminated beam structure with specially shaped outer ground layers that create electrical shielding while providing desired beam spring rate and low bending stresses, coextensively electrically insulating layers, and a coextensive central electrically conductive core, such that the entire structure functions as a tunable impedance (typically 50 ohms for electrical test equipment). These laminated beam structures can be made on a monolithic sheet, using etching and laser cutting techniques to form comb-like sheets that can be bent into a desired shape and assembled into an electrical contactor structure for use in semiconductor test equipment as in FIGS. 1 and 2. The laminates can be formed to create simple cantilevers, or curved beams for optimum tuning of stiffness and spring rate. At the tip, the conductor can have an etched surface, which creates a small contact zone, or the conductor can have a broad flat head created by initially chemically milling or grinding a thicker sheet, or it can have a plated-on or attached (soldered) tip. From the waist down, the conductor structure is typically symmetrical, except that it does not have to have a broad head to contact the interface electronics board. This means that when a chip is pressed into or onto the socket, as at 60 in FIG. 2, there is no alternating fatigue load to wear the socket-to-electronics board interface. The conductor is one of many, made on a sheet by a process such as etching, and thus an entire array of such sheets can be essentially stacked in a nesting fashion and the grounds connected by through-hole plating and/or metal studs, and squeezed together at the waist (with appropriate spacers) to form a two-dimensional array of contact points.

To control spring rate, and to enable planarization of the contacts, the spring effect of the laminated beams can preload the conductors against the underside of a top plate which has holes through which the conductor tips protrude to make contact with the integrated circuit contacts that are to be tested. An elastomeric tube with a conductive outer layer, such as previously described at 36A and 36B, can act as a back-up spring and ground-at-the-tip device beneath the tips of the laminate beams, or a secondary cantilevered metal spring (25A, 25B) can perform the same function. In addition, if the outer surface is made conductive, such as by gold plating, it will create a ground connection directly at the tip of the leads, which greatly helps reduce noise.

The protruding tips that make contact with the leads on the chips can be abrasive, finished or etched, or in the novel form suggested here, they can be wire EDM cut, or machined, to form peaks that penetrate the oxide on the soldered surfaces they must contact, while still being able to slough off solder that often deposits and ruins contacts.

In order to design a laminate structure as described above, one can use a modified form of laminate beam theory which will be summarized below. If the outer layer is to be etched to have the serpentine shape, then the relative stress values given above can be used to scale the modulus of elasticity, and the analysis can proceed with the assumption that the outer layer is solid. After a first-round analytical design is complete, the design can be checked and optimized using a commercially available finite element package.

For a multi-layered structure (e.g., coextensive ground metal, adhesive, Kapton insulator, adhesive, conductor, adhesive, Kapton insulator, adhesive, ground metal), the location of the neutral axis is given by:

$$y_n = \frac{\sum_i^N A_i y_i}{\sum_i^N A_i}$$

where:

$E_i$ is the modulus of elasticity of the ith layer $t_i$ is the thickness of the ith layer $A_i$ is the cross sectional area of the ith layer $I_i$ is the moment of inertia of the ith layer $y_i$ is the location of the ith layer's neutral axis with respect to a datum $y_n$ is the location of the system's neutral axis with respect to a datum The equivalent section modulus can be found from the individual layer properties:

$$EI = \sum_i^N E_i(I_i + A_i(y_i - y_n)^2)$$

For a conventional cantilever beam contact of length L the deflection δ and slope α at the tip of the beam as a function of the applied force are given by:

$$\delta = \frac{FL^3}{3EI} \quad \alpha = \frac{FL^2}{2EI}$$

The conductive tip extends upwards from the beam by H, and the result is that the slope of the beam and the height H causes a longitudinal displacement of the contact tip that causes the contact tip to scrub the chip leads when it makes contact. The scrub displacement must be controlled, and it can be determined to be:

$$\delta_{scrub} = \alpha H$$

The maximum stress in any layer will be a function of the modulus of elasticity $E_i$ and the distance $c_i$ from the laminate neutral axis to the outer surface of the layer:

$$\sigma_i = \frac{FLc_iE_i}{EI}$$

Herein lies the key to the invention, for, as previously pointed out, it is essentially impossible to design a small laminated beam without causing excessively high stresses in the outer layer that yields and cause the beam to fail. When the present invention is used, typically finite element analysis is used to obtain an equivalent effective modulus for the outer layer, such that the above theory can be used, where it assumes that the outer conductive layer is solid, but with a substantially reduced modulus of elasticity, still retains the high yield strength of a metal such as hard copper alloy.

In some cases, it may be desirable to use a curved-beam shape instead of a simple cantilever. The beam curves may not be of a simple 180 degree arc, but may instead be partial connected arcs for which engineering handbooks do not provide straightforward formula. The vertical displacement for an arc section of radius R and total included angle $2\theta_1$, subject to a force F along a chord connecting the ends of the arc, is found using the method of Castigliano:

$$\Delta_Y = 2 \times \frac{FR^3}{EI} \int_{\theta_1}^{\frac{\pi}{2}} (\sin^2\theta - 2\sin\theta\sin\theta_1 + \sin^2\theta_1) d\theta$$

$$\Delta_Y = \frac{2FR^3}{EI} \left( \frac{\pi}{4}(1 + 2\sin^2\theta_1) - \frac{\theta_1}{4}(1 + 2\sin^2\theta_1) - \frac{3\sin 2\theta_1}{4} \right).$$

The scrub (horizontal displacement at the contact tip) component caused by this force can also be found using the method of Castigliano, where after partial differentiation by the virtual force in the direction orthogonal to the load force, the energy integral reduces to:

$$\Delta_X = \frac{FR^3}{EI} \int_{\theta_1}^{\frac{\pi}{2}} (\sin\theta - \sin\theta_1)(\cos\theta_1 - \cos\theta) d\theta$$

$$\Delta_X = \frac{FR^3}{EI} \left( \frac{3 - \cos 2\theta_1 - (2\theta_1 - \pi)\sin 2\theta_1}{4} + \sin\theta_1(1 - 2\sin\theta_1) \right).$$

Important for determining the deflections at the contact point is the slope of each of the sections, which is amplified by the distance between the sections and the contact point (the Abbe error motion):

$$\alpha = \frac{FR^2}{EI} \int_{\theta_1}^{\frac{\pi}{2}} (\sin\theta - \sin\theta_1) d\theta$$

$$\alpha = \frac{FR^2}{EI} \left( \cos\theta_1 + \sin\theta_1 \left( \theta_1 - \frac{\pi}{2} \right) \right).$$

The equations can be used in a spreadsheet to help a person skilled in the art to create a laminate beam of simple cantilevers, bent C-shape beams, or complex "S" shapes effectively loaded in compression, that can then be optimized using finite element analysis.

Further modifications of the invention will also occur to persons skilled in the art, and all such are deemed to fall within the spirit and scope of the invention as defined by the appended claims.

What is claimed is:

1. A contactor assembly for temporary interfacing between an electrical part-to-be-tested and a testing equipment, the contactor having, in combination, one or more flexible mechanical beam structure assemblies comprising a central core conductor beam to the opposing surfaces of which have been laminated co-extensive insulating layers with each layer in turn laminated to an outer contoured co-extensive ground covering that serves as an electrical shield; the beam having a terminal contact zone to provide an exposed contact tip for connecting to the test equipment; and the contactor assembly being provided with means for temporarily attaching the electrical part-to-be-tested to the assembly and in electrical contact with the contactor beam, wherein the flexible beam contactor structure is bent to provide a predetermined mechanical spring rate and stress in the laminated contactor and wherein the beam structure is formed into one of a cantilever beam and a curved beam of appropriate stiffness and spring rate of the flexible beam structure and wherein the beam structure contactor is bent into a substantially U-shaped structure and is positioned abutting a second similar beam structure contactor in the assembly.

2. A contactor assembly as claimed in claim 1 wherein the abutting beam structure contractors are held within an assembly package, with the part-to-be-tested temporarily attached to one side of the package engaging contacts connected with the contactor beams, and the package attachable to the test equipment on another side in engagement with the contactor beams through said contact tips.

3. A contactor assembly as claimed in claim 1 wherein the contouring of the co-extensive ground shield is serpentine, providing successive gaps.

4. A contactor assembly as claimed in claim 3 wherein the serpentine ground shields on opposite sides of the laminated beam structure are positioned to be out-of-phase with one another, preventing beam structure twisting during deflection.

5. A contactor assembly as claimed in claim 3, wherein the serpentine gaps are one of S-shaped and keyhole shape.

6. A contactor assembly as claimed in claim 2 wherein such contacts under the attaching action of the part and the flexibility of the beam, pierce any oxidized layer that may be present on terminals of the part to establish good electrical connection.

* * * * *